United States Patent [19]
Park

[11] Patent Number: 6,093,641
[45] Date of Patent: *Jul. 25, 2000

[54] METHOD FOR FABRICATING SEMICONDUCTOR DEVICE WITH AN INCREASED PROCESS TOLERANCE

[75] Inventor: Jong-Sung Park, Chungcheongbuk-do, Rep. of Korea

[73] Assignee: LG Semicon Co., Ltd., Chungcheonbuk-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/005,229

[22] Filed: Jan. 9, 1998

[30] Foreign Application Priority Data

Apr. 24, 1997 [KR] Rep. of Korea ........................ 97-15433

[51] Int. Cl.$^7$ ................................................ H01L 21/4763
[52] U.S. Cl. ............................ 438/639; 438/595; 257/520
[58] Field of Search ............................ 257/750; 438/672, 438/701, 639, 446, 304, 595, 596, FOR 182, FOR 199; 156/644.1; 430/313

[56] References Cited

U.S. PATENT DOCUMENTS

| | | | |
|---|---|---|---|
| 4,579,812 | 4/1986 | Bower | 430/313 |
| 4,810,666 | 3/1989 | Taji | 438/297 |
| 4,978,419 | 12/1990 | Nanda et al. | 438/701 |
| 5,430,328 | 7/1995 | Hsue | 257/750 |
| 5,500,080 | 3/1996 | Choi | 438/639 |
| 5,543,345 | 8/1996 | Liaw et al. | 438/397 |
| 5,627,095 | 5/1997 | Koh et al. | 438/672 |
| 5,700,731 | 12/1997 | Lin et al. | 438/381 |
| 5,874,359 | 2/1999 | Liaw et al. | 438/640 |

*Primary Examiner*—Wael Fahmy
*Assistant Examiner*—William David Coleman

[57] ABSTRACT

Methods for fabricating a semiconductor device suitable for increasing process tolerance of the device are disclosed. One method includes the steps of sequentially forming an insulating layer, a planarization layer, and a nitride layer over cell transistors formed on a substrate; patterning the nitride layer to define first contact holes; forming polysilicon sidewall spacers on the sides of the patterned nitride layer; removing portions of the planarization layer and the insulating layer using the patterned nitride layer and the polysilicon sidewall spacers, so as to define second contact holes; and forming pad polysilicon layers in the second contact holes, so as to expose portions of the patterned nitride layer. Another method includes the steps of sequentially forming an insulating layer and a planarization layer over cell transistors formed on a substrate; defining pad contact holes through the insulating layer and the planarization layer; forming pad polysilicon layers in the pad contact holes; exposing portions of cap nitride layers of the cell transistors; and forming pad polysilicon sidewall spacers on the sides of the pad polysilicon layer.

24 Claims, 6 Drawing Sheets

METHOD FOR FABRICATING SEMICONDUCTOR DEVICE WITH AN INCREASED PROCESS TOLERANCE

BACKGROUND OF THE INVENTION

1. Field of the Invention

The present invention relates to semiconductor devices and method for forming the same and, more particularly, to a method for fabricating a semiconductor device which is suitable for increasing process tolerance in the step of forming pad polysilicon layers.

2. Discussion of the Related Art

In a conventional semiconductor device, a pad polysilicon layer is formed after cell transistors are formed. The polysilicon layer has a predetermined height for contacting the source and drain regions of the cell transistors to increase process margin in the subsequent process steps. Using this structure, a DRAM (Direct Random Access Memory) having a capacitor over bitline (COB) structure can enhance alignment tolerance. Moreover, in forming a contact hole for contacting a bitline, the aspect ratio of the contact hole is not high due to the presence of the pad polysilicon layer. For this reason, researches and development have been directed to forming the COB structure.

A conventional method for fabricating a semiconductor device will be described with reference to FIGS. 1a to 1e which are cross-sectional views showing process steps of a method for fabricating a semiconductor device.

Referring to FIG. 1a, a device isolation layer is formed on a semiconductor substrate 10 to define an active region, on which cell transistors 1 are then formed.

Referring to FIG. 1b, an oxide layer 2, which functions as an insulating layer, is deposited on the entire surface including the cell transistors 1. Subsequently, a planarization insulating layer 3 is deposited on the oxide layer 2.

Referring to FIG. 1c, the planarization insulating layer 3 and the oxide layer 2 are selectively removed by a photolithography process to form pad contact holes 4, so that source and drain regions of the cell transistors 1 are exposed. The pad contact holes 4 are formed according to the minimum design rule of corresponding devices. For example, for a 256 A Mask, pad contact holes of $0.225 \times 0.225\ \mu m^2$ size are formed.

Referring to FIG. 1d, a polysilicon layer 5a is formed on the entire surface and in the pad contact holes 4.

Referring to FIG. 1e, the polysilicon layer 5a is selectively etched by using a pad mask to form pad polysilicon layers 5b. The pad polysilicon layers 5b are not formed according to the minimum design rule and have a fine pattern size. For example, the width of the pad polysilicon layer 5b is 0.4 and the spacing between the pad polysilicon layers 5b is 0.2. Then a planarization insulating layer (not shown) is formed to begin formation of a capacitor.

As described above, after forming the cell transistors 1, pad polysilicon layers 5b of a predetermined height are formed to contact with the source and drain regions of the cell transistors 1, thus increasing process tolerance of the semiconductor device.

This conventional method for fabricating a semiconductor device, however, has problems. Although process tolerance may be increased by forming pad polysilicon layers, since pad contact holes are formed based on the minimum design rule, tolerance for the patterns used in the step of forming pad contact holes is low. Moreover, since pad polysilicon layers have fine pattern sizes, it is difficult to form precise patterns of pad polysilicon layers on the substrate.

SUMMARY OF THE INVENTION

Therefore, the present invention is directed to a method for fabricating a semiconductor device that substantially obviates one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, a method for fabricating a semiconductor device including a plurality of cell transistors formed on a substrate, comprises the steps of sequentially forming an insulating layer, a planarization layer, and a nitride layer over the cell transistors; patterning the nitride layer to define first contact holes; forming polysilicon sidewall spacers on sides of the patterned nitride layer; removing portions of the planarization layer and the insulating layer, using the patterned nitride layer and the polysilicon sidewall spacers, so as to define second contact holes; and forming pad polysilicon layers in the second contact holes, so as to expose portions of the patterned nitride layer.

Furthermore, another method for fabricating a semiconductor device including a plurality of cell transistors including cap nitride layers formed on a substrate, comprises the steps of sequentially forming an insulating layer and a planarization layer over the cell transistors; defining pad contact holes through the insulating layer and the planarization layer; forming pad polysilicon layers in the pad contact holes; exposing portions of the cap nitride layers of the cell transistors; and forming pad polysilicon sidewall spacer on sides of the pad polysilicon layer.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 2a to 2g are cross-sectional views showing process steps of a method for fabricating a semiconductor device according to the first embodiment of the present invention, and FIGS. 3a to 3h are cross-sectional views showing process steps of a method for fabricating a semiconductor device according the second embodiment of the present invention.

The method for fabricating a semiconductor device according to the first embodiment will be described.

Figure 1A:
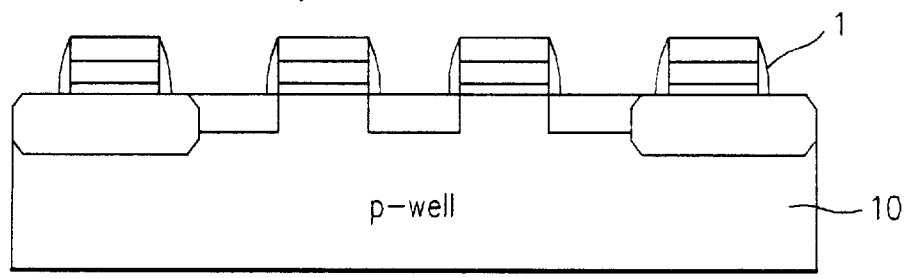
FIGS. 1a to 1e are cross-sectional views showing process steps of a conventional method for fabricating a semiconductor device.
Figure 1B:
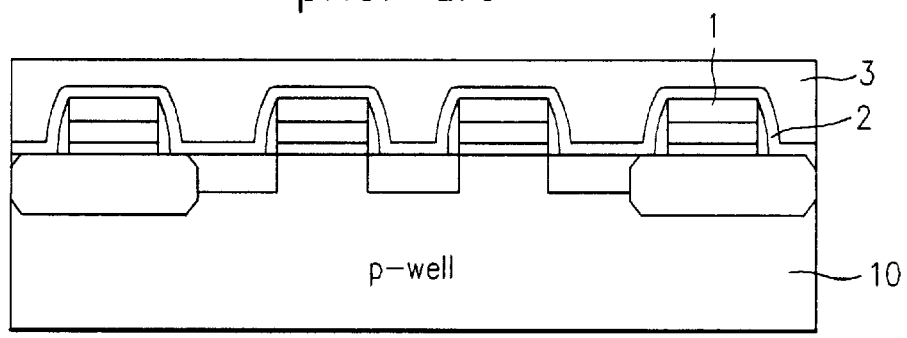
Figure 1C:
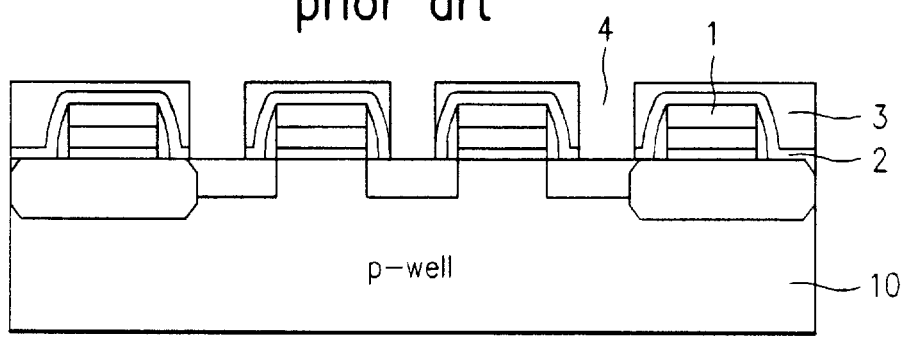
Figure 1D:
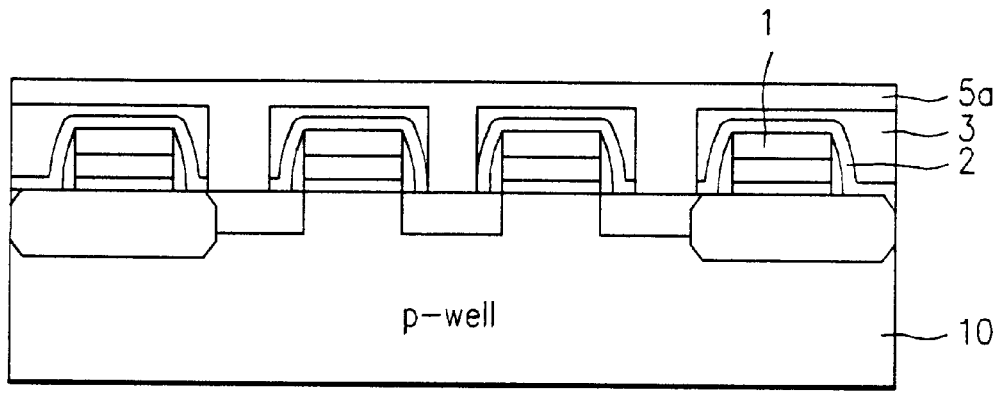
Figure 1E:
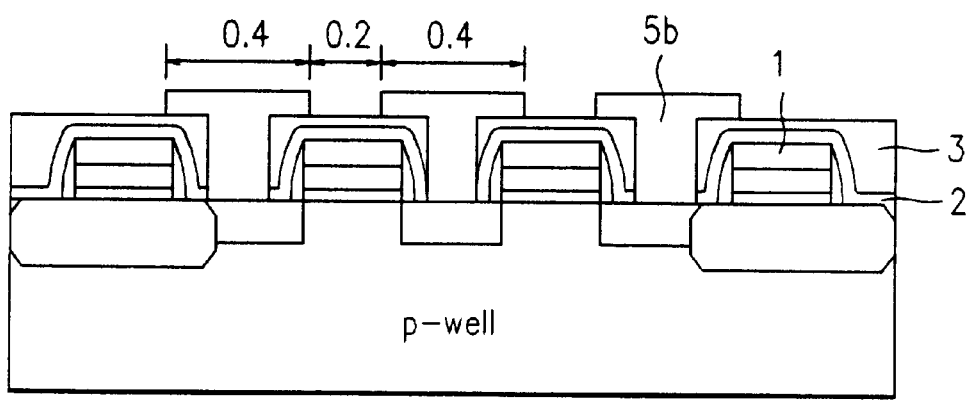
Figure 2A:
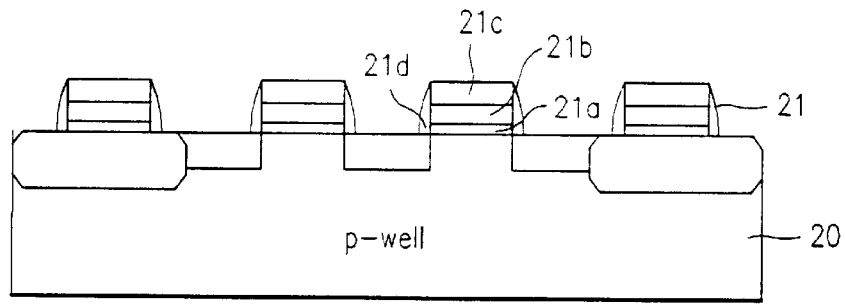
FIGS. 2a to 2g are cross-sectional views showing process steps of a method for fabricating a semiconductor device according to a first embodiment of the present invention.

Referring to FIG. 2a, a device isolation layer is formed on a semiconductor substrate 20 to define an active region, on which cell transistors 21 are then formed. Each of the cell transistors 21 includes a gate oxide layer 21a, a polysilicon layer 21b formed on the gate oxide layer 21a as a gate electrode, a cap nitride layer 21c formed on the polysilicon layer 21b, and nitride sidewall spacers 21d formed on the sides of the stacked-up gate oxide layer 21a, polysilicon layer 21b, and cap nitride layer 21c.

Figure 2B:
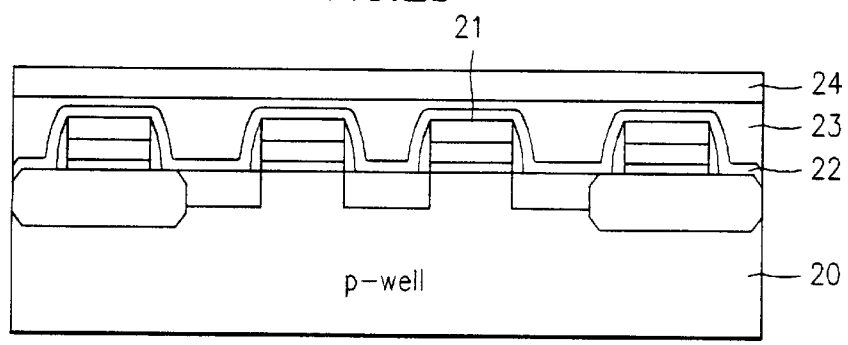

Referring to FIG. 2b, an oxide layer 22 functioning as an insulating layer is formed on the entire surface including the cell transistors 21. A planarization insulating layer 23 is formed on the oxide layer 22 and then a nitride layer 24 is deposited on the planarization insulating layer 23.

Figure 2C:
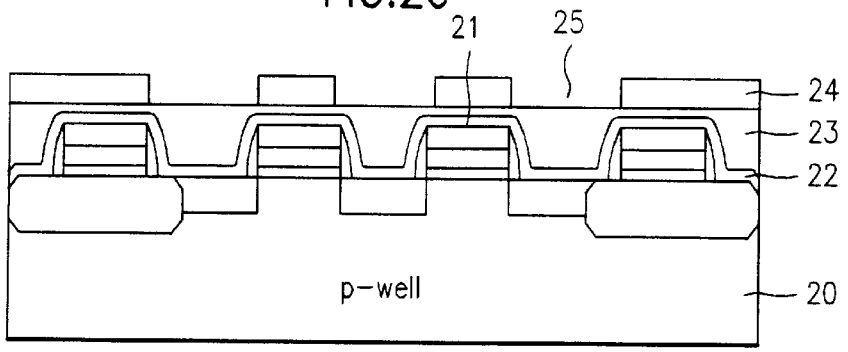

Referring to FIG. 2c, the nitride layer 24 is selectively removed by a photolithography process so as to pattern the nitride layer and define contact holes 25. The size of the contact holes 25 is larger than that of pad contact holes which will be formed subsequently.

Figure 2D:
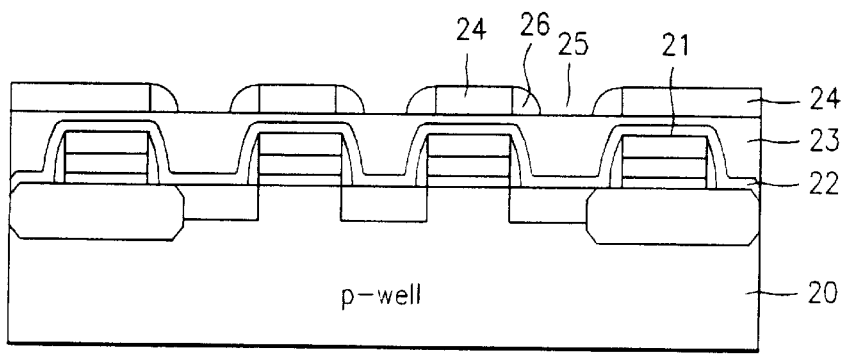

Referring to FIG. 2d, a polysilicon layer is formed on the entire surface including the contact holes 25 and then etched-back selectively to form polysilicon sidewall spacers 26 on the sides of the contact holes 25 and the nitride layer 26.

Figure 2E:
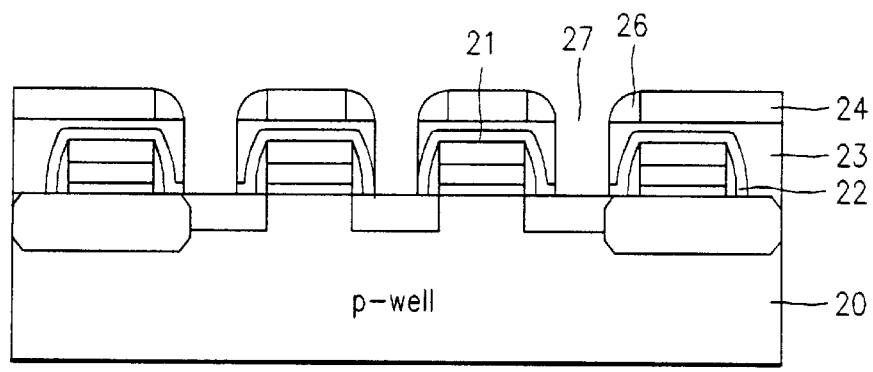

Referring to FIG. 2e, with the patterned nitride layer 24 and the polysilicon sidewall spacers 26 serving as masks, the exposed planarization insulating layer 23 and the oxide layer 22 are selectively removed by a dry-etch process, to expose the source and drain regions of the cell transistors 21. As a result, pad contact holes 27 are defined according to the minimum design rule of corresponding devices. The pad contact holes 27 may have a size smaller than the minimum size permitted by the minimum design rule. In other words, the contact holes 25 which are larger than the pad contact holes are formed, the polysilicon sidewall spacers 26 are formed on the sides of the contact holes 25, and then the pad contact holes 27 are defined using a self-aligned contact (SAC) technique.

Figure 2F:
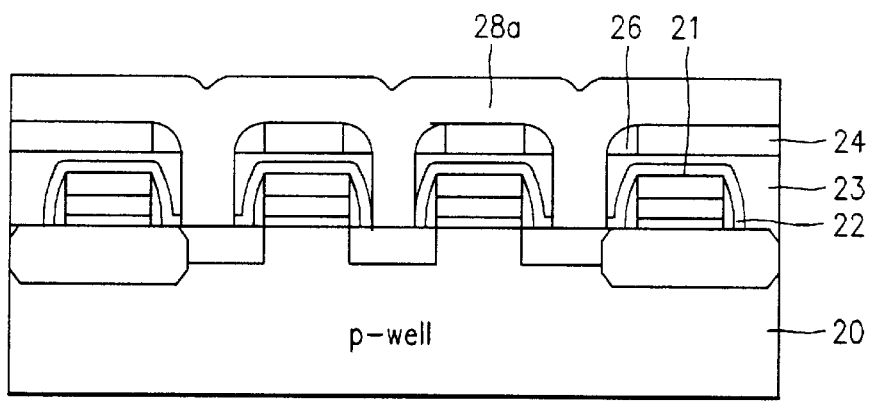

Referring to FIG. 2f, a polysilicon layer 28a is formed on the entire surface including the pad contact holes 27, e.g., by depositing polysilicon on the nitride layer 24 and in the pad contact holes 27.

Figure 2G:
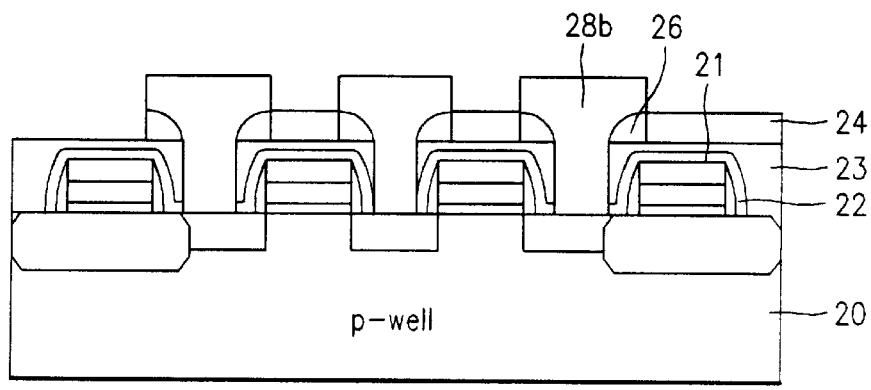

Referring to FIG. 2g, the polysilicon layer 28a is selectively removed with a dry-etch or a chemical mechanical polishing (CMP) process to expose the patterned nitride layer 24, thus forming pad polysilicon layers 28b.

Another method for forming pad polysilicon layers of a semiconductor device according to the second embodiment of the present invention will be described with reference to FIGS. 3a to 3h. In the second embodiment, alignment tolerance is further enhanced compared to the first embodiment.

Figure 3A:
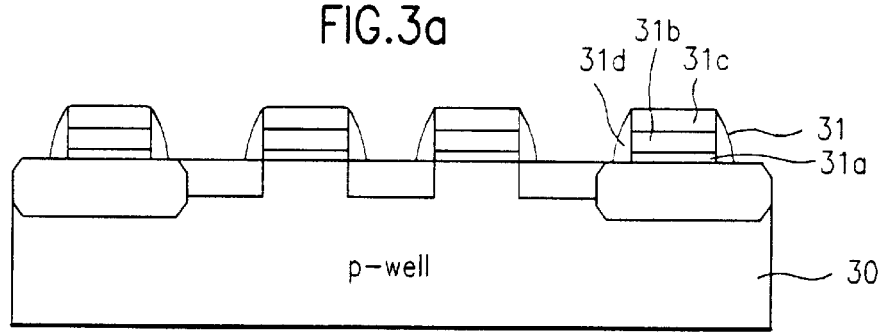
FIGS. 3a to 3h are cross-sectional views showing process steps of a method for fabricating a semiconductor device according to a second embodiment of the present invention.

Referring to FIG. 3a, a device isolation layer is formed on a semiconductor substrate 30 to define an active region, upon which cell transistors 31 are then formed. Each of the cell transistors 31 includes a gate oxide layer 31a, a polysilicon layer 31b formed on the gate oxide layer 31a as a gate electrode, a cap nitride layer 31c formed on the polysilicon layer 31b, and nitride sidewall spacers 31d formed on the sides of the stacked-up gate oxide layer 31a, polysilicon layer 31b, and cap nitride layer 31c.

Figure 3B:
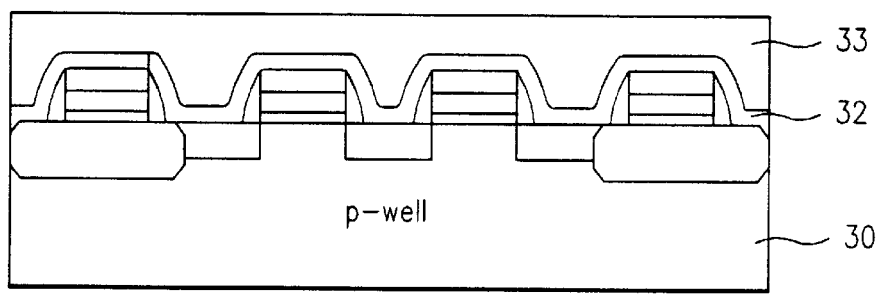

Referring to FIG. 3b, an oxide layer 32, functioning as an insulating layer, is formed on the entire surface including the cell transistors 31. A planarization insulating layer 33 is formed on the oxide layer 32.

Figure 3C:
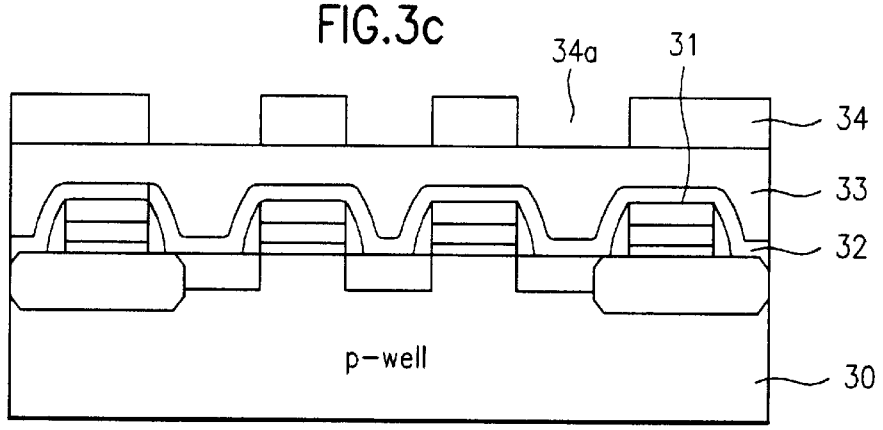

Referring to FIG. 3c, a photoresist film 34 is coated on the planarization insulating layer 33 and patterned to expose areas through which pad contact holes will be defined subsequently. The photoresist film 34 as patterned includes holes 34a therethrough. The top area of the holes 34a is larger than the area in which a pad polysilicon layer is to be formed in the subsequent process steps.

Figure 3D:
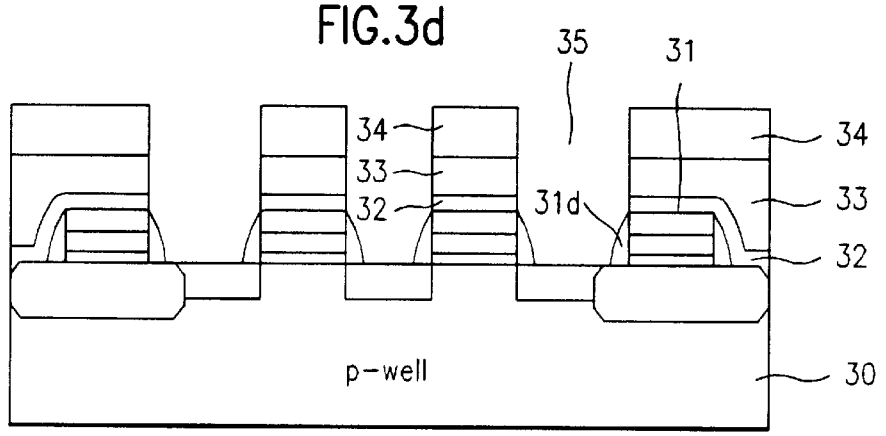

Referring to FIG. 3d, using the patterned photoresist film 34 as a mask, the planarization insulating layer 33 and the oxide layer 32 are selectively dry-etched to define pad contact holes 35. However, the nitride sidewall spacers 31d remain. The pad contact holes 35 are formed by the SAC process using the cap nitride layer 31c and the nitride sidewall spacers 31d.

Figure 3E:
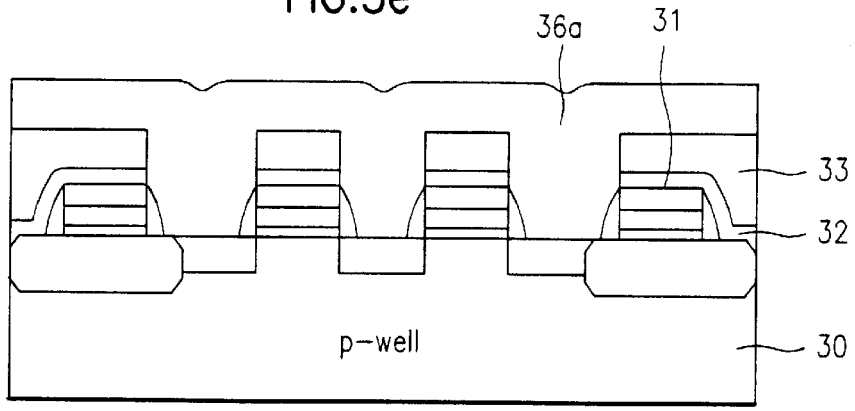

Referring to FIG. 3e, the remaining photoresist film 34 is completely removed and another polysilicon layer 36a is formed on the entire surface including the pad contact holes 35.

Figure 3F:
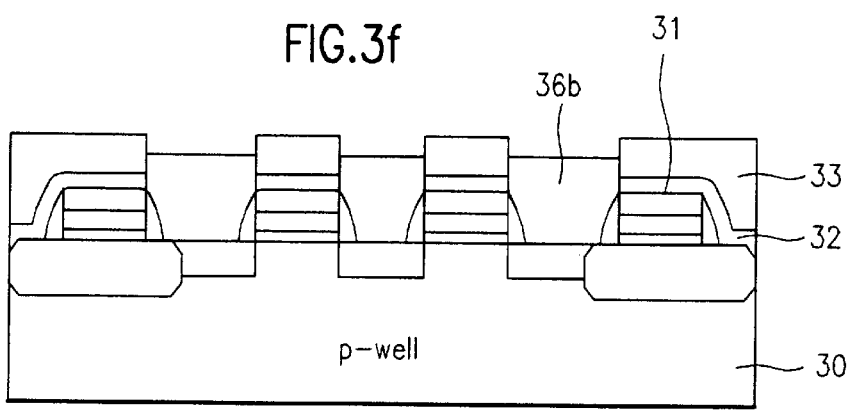

Referring to FIG. 3f, the polysilicon layer 36a is partially removed by a dry-etch or a chemical mechanical polishing (CMP) process, to expose the patterned planarization insulating layer 33, thus forming pad polysilicon layers 36b between the planarization insulating layers 33.

Figure 3G:
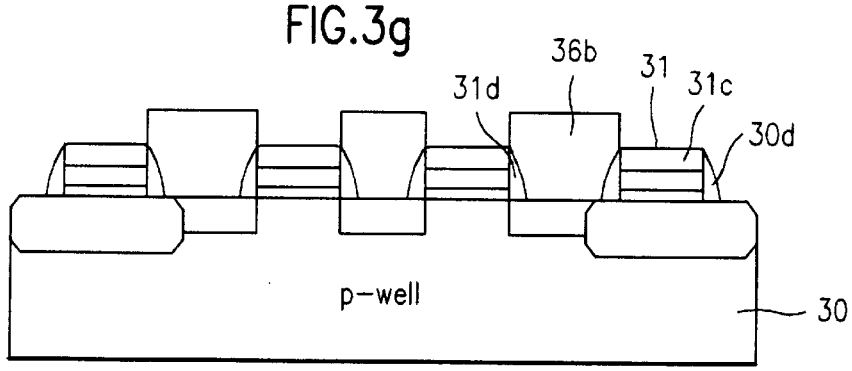

Referring to FIG. 3g, the planarization insulating layer 33 and the oxide layer 32 are completely removed by wet-etch to expose the cap nitride layer 31c and the nitride sidewall spacer 31d.

Figure 3H:
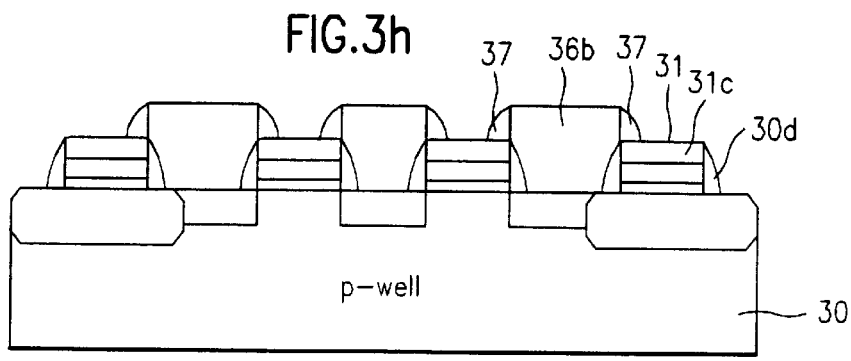

Referring to FIG. 3h, still another polysilicon layer is formed on the entire surface including the pad polysilicon layers 36b and then etched-back to form pad polysilicon sidewall spacers 37 on the sides of the pad polysilicon layers 36b.

In the method of forming the pad polysilicon layers according to the embodiments of the present invention, instead of using pad masks, the SAC process is performed to provide enough tolerance in forming the pad contact holes, so that better alignment tolerance can be achieved in carrying out the subsequent process steps. The top areas of the pad polysilicon layers are larger than the top areas of the pad contact holes, as much as the size of the pad polysilicon sidewall spacers.

The methods for fabricating a semiconductor device according to the embodiments of the present invention have advantages including the following.

In the present methods, pad masks are not employed in forming pad polysilicon layers, thereby simplifying the process of forming the pad polysilicon layers. Further, since pad contact holes are formed by a SAC process, alignment tolerance for the subsequent process steps is enhanced. The present methods can be advantageously applied to fabricate highly-integrated devices. Furthermore, the top areas of the pad polysilicon layers are larger than the top areas of the pad contact holes, thereby increasing alignment tolerance for the subsequent process steps.

It will be apparent to those skilled in the art that various modifications and variations can be made in the methods for fabricating a semiconductor device according to the present invention without departing from the spirit or scope of the inventions. Thus, it is intended that the present invention cover the modifications and variations of this invention provided they come within the scope of the appended claims and their equivalents.

What is claimed is:

1. A method for fabricating a semiconductor device including a plurality of cell transistors formed on a substrate, comprising the steps of:

sequentially forming an insulating layer, a planarization layer, and a nitride layer over the cell transistors;

patterning the nitride layer to form a plurality of nitride layer islands directly above gate electrodes of the cell transistor and to define first contact holes;

conformally depositing a polysilicon layer on the entire resultant surface and forming polysilicon sidewall spacers on sides of the patterned nitride layer;

removing portions of the planarization layer and the insulating layer, using the patterned nitride layer and the polysilicon sidewall spacers, so as to define second contact holes; and forming pad polysilicon layers in the second contact holes, so as to expose portions of the patterned nitride layer.

2. The method as claimed in claim 1, wherein the removing step includes the step of:

removing the portions of the planarization layer and the insulating layer using a self-aligned contact (SAC) technique.

3. The method as claimed in claim 1, wherein the sequentially forming step includes the step of:

forming an oxide layer as the insulating layer on and between the cell transistors.

4. The method as claimed in claim 1, wherein the first contact holes are larger in width than the second contact holes.

5. The method as claimed in claim 1, wherein the removing step includes the step of:

dry-etching the planarization layer and the insulating layer.

6. The method as claimed in claim 4, wherein the second contact holes are pad contact holes having a size less than or equal to a minimum pattern size.

7. The method as claimed in claim 1, wherein the removing step includes the step of:

removing the portions of the planarization layer and the insulating layer with a dry-etch process, using a self-aligned contact (SAC) technique and the patterned nitride layer and the polysilicon sidewall spacers as masks.

8. The method as claimed in claim 1, wherein the patterning step includes the steps of:

selectively etching the nitride layer to form the nitride layer islands.

9. The method as claimed in claim 1, wherein the step of forming the pad polysilicon layers includes the steps of:

depositing a polysilicon layer on the patterned nitride layer and in the second contact holes, and removing portions of the polysilicon layer by one of a dry-etching process and a chemical mechanical polishing (CMP) process.

10. The method as claimed in claim 1, wherein the step of forming the polysilicon sidewall spacers includes the steps of:

depositing a polysilicon layer on the patterned nitride layer and in the first contact holes, and etching-back the polysilicon layer to form the polysilicon sidewall spacers.

11. The method as claimed in claim 1, wherein each of the cell transistors includes a gate oxide layer formed on the substrate, a polysilicon layer formed on the gate oxide layer, a cap nitride layer formed on the polysilicon layer, and nitride sidewall spacers formed on the sides of the cap nitride layer, the polysilicon layer and the gate oxide layer.

12. A method for fabricating a semiconductor device including a plurality of cell transistors having cap nitride layers formed on a substrate, comprising the steps of:

sequentially forming an insulating layer and a planarization layer over the cell transistors;

patterning the insulating layer and the planarization layer to form a plurality of insulating layer islands and a plurality of planarization layer islands directly above gate electrodes of the cell transistors and to define pad contact holes between the planarization layer islands;

forming pad polysilicon layers in the pad contact holes;

exposing portions of the cap nitride layers of the cell transistors; and conformally depositing another polysilicon layer on the entire resultant surface and forming pad polysilicon sidewall spacers on sides of the pad polysilicon layers.

13. The method as claimed in claim 12, wherein the sequentially forming step includes the step of:

forming an oxide layer as the insulating layer on and between the cell transistors.

14. The method as claimed in claim 12, wherein the patterning step includes the steps of:

forming a photoresist pattern on the planarization layer, removing portions of the insulating layer and the planarization layer using the photoresist pattern, and then removing the photoresist pattern.

15. The method as claimed in claim 12, wherein each of the cell transistors includes a gate oxide layer formed on the substrate, a polysilicon layer formed on the gate oxide layer, the cap nitride layer formed on the polysilicon layer, and nitride sidewall spacers formed on the sides of the gate oxide layer, the polysilicon layer and the cap nitride layer.

16. The method as claimed in claim 15, wherein in the defining step, the nitride sidewall spacers of the cell transistors remain in the pad contact holes.

17. The method as claimed in claim 12, wherein in the defining step, the planarization layer and the insulating layer are selectively removed with a dry-etch process, using a self-aligned contact (SAC) process and a photoresist pattern as a mask.

18. The method as claimed in claim 12, wherein the step of forming the pad polysilicon layers includes the steps of:

forming a polysilicon layer on the planarization layer and in the pad contact holes, and etching-back the polysilicon layer to expose portions of the planarization layer.

19. The method as claimed in claim 12, wherein in the step of forming the pad polysilicon layers, a chemical mechanical polishing (CMP) process is performed to expose portions of the planarization layer.

20. The method as claimed in claim 12, wherein the exposing step includes the step of:

removing the planarization layer and the insulating layer.

21. The method as claimed in claim 12, wherein the step of forming the pad polysilicon sidewall spacers includes the steps of:

forming a polysilicon layer over the pad polysilicon layers and the cell transistors, and etching-back the polysilicon layer to form the pad polysilicon sidewall spacers.

22. The method as claimed in claim 1, wherein the polysilicon sidewall spacers are formed such that the bottom of the spacers are at the same level as the top of the planarazation layer.

23. The method as claimed in claim 12, wherein edges of the pad contact holes are vertically aligned with edges of the gate electrodes.

24. The method as claimed in claim 12, wherein sidewall spacers of the gate electrode are exposed when the pad contact holes are defined.

* * * * *